(12) United States Patent
Okada et al.

(10) Patent No.: US 6,806,640 B2
(45) Date of Patent: Oct. 19, 2004

(54) ORGANIC ELECTROLUMINESCENCE DEVICE HAVING CURRENT INJECTION LAYER BETWEEN LIGHT EMITTING LAYER AND CATHODE

(75) Inventors: Hiroyuki Okada, Toyama (JP); Shigeru Tabatake, Toyama (JP); Shigeki Naka, Nei-gun (JP); Hiroyoshi Onnagawa, Toyama (JP)

(73) Assignee: President of Toyama University, Toyama (JP)

( * ) Notice: Subject to any disclaimer, the term of this patent is extended or adjusted under 35 U.S.C. 154(b) by 0 days.

(21) Appl. No.: 10/364,497

(22) Filed: Feb. 12, 2003

(65) Prior Publication Data

US 2003/0151359 A1 Aug. 14, 2003

(30) Foreign Application Priority Data

Feb. 13, 2002 (JP) ..................................... 2002-035604

(51) Int. Cl.$^7$ ............................................... H05B 33/00
(52) U.S. Cl. ..................................................... 313/504
(58) Field of Search ................................. 313/503, 504, 313/506; 428/690

(56) References Cited

U.S. PATENT DOCUMENTS 6,316,874 B1 * 11/2001 Arai et al. ................... 313/504
6,656,608 B1 * 12/2003 Kita et al. .................... 313/504

FOREIGN PATENT DOCUMENTS

| JP | 10-162959 | 6/1998 |
| JP | 10-270172 | 10/1998 |
| JP | 2000-299189 | 10/2000 |
| JP | 2001-176673 | 6/2001 |
| JP | 2002-289360 | 10/2002 |

OTHER PUBLICATIONS

C. W. Tang, et al., "Organic Electroluminescent Diodes", Appl. Phys. Lett., 51 (12), Sep. 21, 1987, pp. 913–915.
C. W. Tang, et al., "Electroluminescence of Doped Organic Thin Films", J. Appl. Phys., 65 (9), May 1, 1989, pp. 3610–3616.
Hitoshi Nakada, et al., "Applications of Organic LED's ~256×64 Dot–Matrix Display~", EL96 Berlin, Edited by R. H. Mauch and H. –E. Gumlich, pp. 385–390.
Takeo Wakimoto, et al., "Organic EL Cells Using Alkaline Metal Compounds as Electron Injection Materials", IEEE Transactions on Electron Devices, vol. 44, No. 8, Aug. 1997, pp. 1245–1248.
L. S. Hung, et al., "Enhanced Electron Injection in Organic Electroluminescence Devices Using an Al/LiF Electrode", Appl. Phys. Lett. 70 (2), Jan. 13, 1997, pp. 152–154.

* cited by examiner

*Primary Examiner*—Joseph Williams
(74) *Attorney, Agent, or Firm*—Oblon, Spivak, McClelland, Maier & Neustadt, P.C.

(57) ABSTRACT

Provided is an organic electroluminescence device which operates at a low voltage, has a uniform light emission surface, and can display high-quality images. In an organic electroluminescence device, an anode, a hole transport layer made of an organic compound, a light emitting layer made of an organic compound, and a cathode are stacked in the order named, and an electron injection layer containing a lanthanoid oxide is formed between the light emitting layer and cathode. The anode and/or cathode is made of a transparent conductive material. In another organic electroluminescence device, an anode, a hole transport layer made of an organic compound, a light emitting layer made of an organic compound, and a cathode are stacked in the order named, and an electron injection layer formed by mixing a lanthanoid metal oxide and organic compound is formed between the light emitting layer and cathode.

6 Claims, 3 Drawing Sheets

ORGANIC ELECTROLUMINESCENCE DEVICE HAVING CURRENT INJECTION LAYER BETWEEN LIGHT EMITTING LAYER AND CATHODE

CROSS-REFERENCE TO RELATED APPLICATIONS

This application is based upon and claims the benefit of priority from the prior Japanese Patent Application No. 2002-035604, filed Feb. 13, 2002, the entire contents of which are incorporated herein by reference.

BACKGROUND OF THE INVENTION

1. Field of the Invention

The present invention relates to the material and structure of a cathode of an organic electroluminescence device having an electron injection layer between a light emitting layer and the cathode. More specifically, the present invention relates to an electrode structure for improving the efficiency of injection of electrons into a thin organic film, and to an organic electroluminescence device electrode structure having a two-layered structure including an ultra thin film of an insulating compound containing a lanthanoid, and a metal.

2. Description of the Related Art

As a man-machine interface in an information society, an organic electroluminescence device using an organic compound as an electroluminescence layer is beginning to be put into practice. An electroluminescence device is a light emitting device using electroluminescence. Compared to a liquid crystal display which is a light receiving type display currently put into practice, this organic electroluminescence device using an organic compound requires no back light since the device itself emits light. Therefore, the organic electroluminescence device is expected to be used as a display of a portable electronic apparatus or as a thin flat display.

A presently developed organic electroluminescence device has a two-layered structure between a metal electrode functioning as a cathode and a transparent electrode functioning as an anode. This two-layered structure is made up of a thin organic light emission film and thin organic hole transport film which are made of organic materials and stacked. The thin organic hole transport film has a function of facilitating injection of holes from the anode, and a function of blocking electrons.

Another presently developed organic electroluminescence device has a three-layered structure between the metal electrode and transparent electrode. This three-layered structure is made up of a thin organic electron transport film, thin organic light emission film, and thin organic hole transport film. The thin organic electron transport film has a function of facilitating injection of electrons from the cathode.

For example, Tang and VanSlyke reported an organic electroluminescence device having high luminance, a low driving voltage, a small size, and high efficiency, in C. W. Tang and S. A. VanSlyke: Applied Physics Letter, 51(12), pp. 913–915 (1987). This report was epoch-making in that the efficiency of the conventional organic electroluminescence device was improved by an order of magnitude by forming a very thin film of an organic emission material, from which an amorphous film is readily obtainable, by vacuum deposition. This device realized an external quantum efficiency of 1%, a luminous efficiency of 1.5 lm/W, and a luminance of 1,000 $cd/m^2$ with a driving voltage of 10V or less. Also, this device achieved a low voltage by using a magnesium-silver alloy having a relatively small work function as a cathode.

At the present time after the elapse of more than 10 years from this report, higher efficiency and longer life are achieved, and a matrix panel using an organic electroluminescence device is put on the market.

In addition, Tang et al. reported the improvement of the luminous efficiency by mixing of a slight amount of a dye, such as a coumarin dye or pyran derivative, having high fluorescence quantum efficiency (C. W. Tang, S. A. VanSlyke, and C. H. Chen: Journal of Applied Physics, 65(9), pp. 3,610–3,616 (1989).

After that, Nakada and Tohma reported an organic electroluminescence device having higher efficiency. That is, they reported that a luminous efficiency of 12 lm/W and a luminance exceeding 100,000 $cd/m^2$ were achieved by mixing a quinacridone derivative having high fluorescence quantum efficiency in a light emitting layer, and using an aluminum alloy containing lithium having a small work function as a cathode (H. Nakada and T. Tohma: Inorganic and Organic Electroluminescence (EL96 Berlin), (Edited by R. H. Mauch and H. E. Gumlich) pp. 385–390 (1996)).

An organic electroluminescence device is a device which generates excitons as electron-hole pairs by injecting electrons and holes into an organic film, and emits light by recombination of these electron-hole pairs. Accordingly, the emission intensity is generally proportional to the injection amount of electrons and holes. To realize a high-efficiency organic electroluminescence device, therefore, a large current must be injected with a low voltage. For this purpose, it is very effective to use a low-work-function metal which readily emits electrons at low voltages, as a cathode material. However, a low-work-function metal such as an aluminum alloy containing lithium is generally unstable and easily oxidizes in air. Hence, when used as an electrode of an organic electroluminescence device, the metal deteriorates fast. Therefore, it is being desired to use a stabler cathode material and develop an electrode structure.

To solve this problem, Wakimoto et al. successfully fabricated a stabler organic electroluminescence device by forming, on an organic layer, a very thin film 1 nm thick or less made of an oxide of a low-work-function metal such as lithium or cesium as a cathode material, and forming an aluminum electrode on this very thin film (T. Wakimoto, Y. Fukuda, K. Nagayama, A. Yokoi, H. Nakada, and M. Tsuchida: IEEE Transaction on Electron Devices, 44(8), pp. 1,245/1,248 (1997)). They reported that this structure made it possible to fabricate a high-efficiency organic electroluminescence device having high reproducibility.

Also, Hung et al. reported a high-efficiency organic electroluminescence device in which a fluoride layer of a very thin lithium film 1 nm thick or less was formed as a cathode material between an organic layer and aluminum cathode layer (L. S. Hung, C. W. Tang, and M. G. Mason: Applied Physics Letter, 70(2), pp. 153–154 (1997)).

In these organic electroluminescence devices of the above reports, however, insulating layers such as an oxide layer and fluoride layer are very thin. Therefore, a slight change in the thickness of this insulating layer poses problems such as an increase in the driving voltage and an increase of a non-light-emitting portion. That is, a thickness change of the insulating layer dramatically changes the characteristics of the organic electroluminescence device. Therefore, in the fabrication of an organic electroluminescence device on a large-area substrate, the uniformity of the thickness of the insulating layer is very important. Accordingly, it is presumably necessary to solve problems in the fabrication process.

The inventors of this application developed an organic electroluminescence device for providing an electroluminescence light emitting device which solved the above problems, operated at a low voltage, had a light emission surface having uniform emission intensity under the same conditions, and was capable of high-quality display, and filed a patent in 2001 (Jpn. Pat. Appln. KOKAI Publication No. 2002-289360). This organic electroluminescence device according to the above application has a substrate which is transparent in the visible range, an electrode formed on the substrate and transparent in the visible range, an organic layer formed on the electrode and having a hole transport function, an organic layer formed on the organic hole transport layer and having an electron transport function and light emitting function, and an electrode containing erbium formed on the organic layer having the functions of electron transport and light emission.

BRIEF SUMMARY OF THE INVENTION

The present invention continues to the invention disclosed in the patent application described above, and provides an organic electroluminescence device which similarly operates at a low voltage and is also usable as a flat display. That is, it is an object of the present invention to solve the drawbacks of the conventionally used cathode materials, and provide an organic electroluminescence electrode structure having a more uniform light emission surface with a lower voltage, and capable of displaying images with higher quality.

As described in an embodiment, the present invention relates to an organic electroluminescence device wherein an anode, a hole transport layer made of an organic compound, a light emitting layer made of an organic compound, and a cathode are stacked in the order named, and an electron injection layer containing a lanthanoid oxide is formed between the light emitting layer and cathode.

As described in an embodiment, the present invention relates to an organic electroluminescence device wherein an anode, a hole transport layer made of an organic compound, a light emitting layer made of an organic compound, and a cathode are stacked in the order named, and an electron injection layer containing a lanthanoid fluoride is formed between the light emitting layer and cathode.

As described in an embodiment, the present invention relates to an organic electroluminescence device wherein an anode, a hole transport layer made of an organic compound, a light emitting layer made of an organic compound, and a cathode are stacked in the order named, and an electron injection layer formed by mixing a lanthanoid oxide and organic compound is formed between the light emitting layer and cathode.

As described in an embodiment, the present invention relates to an organic electroluminescence device wherein an anode, a hole transport layer made of an organic compound, a light emitting layer made of an organic compound, and a cathode are stacked in the order named, and an electron injection layer formed by mixing a lanthanoid fluoride and organic compound is formed between the light emitting layer and cathode.

DETAILED DESCRIPTION OF THE INVENTION

Figure 1:
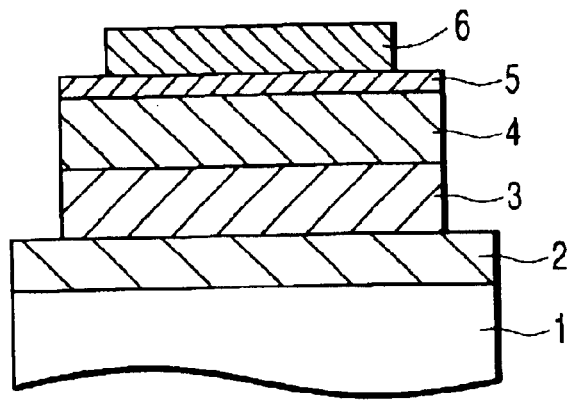
FIG. 1 is a schematic sectional view showing the electrode structure of an organic electroluminescence device according to the first embodiment of the present invention.

Embodiments of the present invention will be described below with reference to the accompanying drawing. The following explanation is an embodiment related to the present invention, and has as its object to illustrate the general principle of the invention. Therefore, the present invention is not limited to the arrangements practically described in the section of this embodiment and in the accompanying drawing. In the following detailed description and in the drawing, the same reference numerals denote the same elements.

FIG. 1 shows the first embodiment of an organic electroluminescence device according to the present invention. As shown in FIG. 1, in the organic electroluminescence device of this embodiment, a first electrode 2 is formed by a general method on one surface of a transparent substrate 1 made of, e.g., glass, quartz, or resin. This first electrode 2 is transparent in the visible range or semitransparent where necessary. As the electrode material, it is possible to use, e.g., ITO (Indium Tin Oxide) having a sheet resistance of 50 Ω or less.

As this first electrode, a conductive material having a large work function is desired. Instead of ITO, a thin gold film about 5 to 150 nm thick can also be used. When this thin gold film is used, the electrode is semitransparent. This first electrode 2 can be formed into stripes (not shown) at a predetermined pitch, although the first electrode 2 is not limited to this shape. The pitch can be a few tens of $\mu$m to several hundred $\mu$m. When an ITO film is used as the first electrode 2, the thickness is desirably 10 to 200 nm.

On the surface of the first electrode 2, a thin hole transport film 3 about 50 nm thick made of an organic hole transport film material is formed. On top of this thin hole transport film 3, a thin electron transport light emitting film 4 about 50 nm thick made of an organic electron transport light emitting film material is stacked.

As the hole transport film material, it is possible to use, e.g., a triphenyl amine derivative (e.g., TPD; N,N'-diphenyl-N,N'-bis(3-methyl)-1,1'-biphenyl-4,4'-diamine), hydrazone derivative, or arylamine derivative.

As the electron transport light emitting film material, it is possible to use, e.g., an aluminum quinolinol complex ($Alq_3$), oxadiazole derivative, benzoxazolethiophene derivative, perylene derivative, or phenanthroline derivative.

The thin films of these hole transport film material and electron transport light emitting film material can be formed by various methods such as vacuum deposition mainly using low-molecular organic materials, spin coating mainly using high-molecular materials, and casting. Any method can be applied to the fabrication process of the organic electroluminescence device by matching the method with the characteristics of the thin film materials.

The necessary functions of the light emitting materials such as the hole transport film material and electron transport light emitting film material need only be such that light can be generated by recombination of excitons made up of pairs of holes and electrons injected into these materials. More specifically, materials having a hole transport function, an electron transport function, a light emitting function, a function of bipolar conduction (conduction of both of holes and electrons) holes and electrons, a light emitting and electron transport function, a light emitting and hole transport function, and a dipole transport and light emitting function can be combined as needed. Also, a single material having all the above functions is available. Therefore, the materials can be properly chosen from these organic materials having various characteristics.

On the surface of the thin electron transport light emitting film 4, an ultra thin insulating film 5 about 0.1 to 3 nm thick made of a lanthanoid-based insulating material is stacked. This ultra thin insulating film 5 has a function as an electron injection layer. That is, the ultra thin insulating film 5 increases the electron injection amount by the tunnel effect or by a lowering of the effective electron barrier caused by the formation of a charged double layer, thereby functioning as an electron injection layer.

In this specification, lanthanoids mean 15 elements having atomic numbers 57 to 71, i.e., lanthanum La, cerium Ce, praseodymium Pr, neodymium Nd, promethium Pm, samarium Sm, europium Eu, gadolinium Gd, terbium Tb, dysprosium Dy, holmium Ho, erbium Er, thulium Tm, ytterbium Yb, and lutetium Lu. As a lanthanoid-based insulating material, it is possible to use a lanthanoid oxide such as $La_2O_3$, $Ce_2O_3$, $Pr_2O_3$, or $Lu_2O_3$, or a lanthanoid fluoride such as $LaF_3$, $CeF_3$, $PrF_3$, or $LuF_3$. Instead of a lanthanoid-based insulating material, LiF can also be used as an electron injection insulating material.

The thin insulating film 5 made of a lanthanoid-based insulating material is formed using primarily a deposition method giving no damage to the thin electron transport light emitting film 4. It is also possible to use a sputtering method such as DC, AC, or ECR sputtering, a low-temperature plasma method, or CVD such as ECR CVD.

On the surface of the insulating material described above, a second electrode 6 about 10 to 200 nm thick made of a predetermined electrode material is formed. This second electrode 6 can be formed into stripes (not shown) at a predetermined pitch so as to face the first electrode 2 in a direction perpendicular to it, although the electrode shape is not restricted to this pattern. The second electrode 6 can be formed by a general mask deposition method. That is, a predetermined electrode pattern can be formed by covering an unnecessary portion of a second electrode with a mask having an appropriate pattern, and vertically depositing an electrode material. If a fine structure is necessary, a desired pattern can be formed by using lithography.

As this second electrode, it is possible to use a metal having a small work function, e.g., silver, aluminum, magnesium, or indium, or an alloy of any of these metals. It is also possible to use a conductive metal such as gold, copper, or chromium, or a conductive polymer material such as polyaniline or polypyrrole. If necessary, a transparent electrode material such as ITO can also be used as the material of the second electrode 6.

A material containing erbium can also be used as the second electrode material. Furthermore, on this layer containing erbium, it is possible to additionally form a conductive metal, e.g., aluminum, gold, copper, or chromium, having conductivity higher than that of erbium, or a conductive polymer layer of, e.g., polyaniline or polypyrrole.

After this second electrode 6 is formed, a protective layer (not shown) is appropriately formed. This protective layer can be formed by a resin such as phenol or epoxy, and shields the thin hole transport film 3, thin electron transport light emitting film 4, thin lanthanoid-based insulating film 5, and second electrode 6 from the atmosphere. As another method of shielding the organic electroluminescence device from the atmosphere, it is also possible to adhere the transparent substrate 1 to an enclosure such as a sealing can, glass, or resin to seal the organic electroluminescence device, and encapsulate an inert gas such as nitrogen or argon.

As an example of the thin film deposition process, the thin hole transport film 3, thin electron transport light emitting film 4, and second electrode 6 can be formed by a vacuum degree of $1\times10^{-5}$ Torr and a deposition rate of 1 nm/sec. The thin hole transport film 3 and thin electron transport light emitting film 4 can also be formed by another thin film formation technique such as spin coating, instead of deposition. The second electrode 6 can also be formed by sputtering or another arbitrary thin film vacuum formation technique, instead of deposition.

When a DC voltage is applied to the organic electroluminescence device having the above structure by using the first electrode 2 as an anode and the second electrode 6 as a cathode, holes are injected from the first electrode 2 into the thin electron transport light emitting film 4 via the thin hole transport film 3. Electrons are injected from the second electrode 6 into the thin electron transport light emitting film 4 via the thin lanthanoid-based insulating film 5. In the thin electron transport light emitting film 4, recombination of the injected holes and electrons occurs, and light is emitted when excitons generated by this recombination fall from the excited state to the ground state. Note that light having various colors such as red, blue, and green can be emitted by properly selecting the molecular structure of the thin electron transport light emitting film 4, thereby changing the energy difference between the excited state and ground state.

Figure 2:
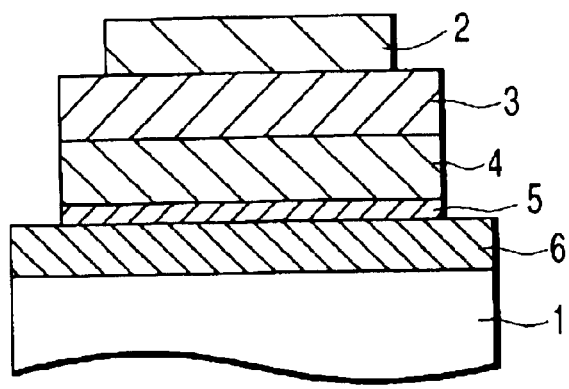
FIG. 2 is a schematic sectional view showing the electrode structure of an organic electroluminescence device according to the second embodiment of the present invention.

FIG. 2 shows the second embodiment of the organic electroluminescence device of the present invention. The structure of this second embodiment is the inverse of the first embodiment. That is, as shown in FIG. 2, in the organic electroluminescence device of this embodiment, a second electrode 6 made of a predetermined electrode material is formed on one surface of a transparent substrate 1.

This second electrode 6 is formed into stripes (not shown) at a predetermined pitch, e.g., a pitch of a few tens of $\mu$m to several hundred $\mu$m, with a thickness of about 10 to 200 nm.

On the surface of the second electrode 6, an ultra thin insulating film 5 about 0.1 to 3 nm thick made of a lanthanoid-based insulating material is stacked. On the surface of this thin insulating film 5, a thin electron transport light emitting film 4 about 50 nm thick made of a electron transport light emitting film material, and a thin hole transport film 3 about 50 nm thick made of a hole transport film material are stacked in this order. On the surface of the thin hole transport film 3, a first electrode 2 made of a predetermined electrode material is formed. This first electrode 2 has a thickness of about 10 to 200 nm. The first electrode 2 can be formed into stripes (not shown) at a predetermined pitch so as to face the second electrode 6 in a direction perpendicular to the stripes of the second electrode 6.

The second electrode 6, thin lanthanoid-based insulating film 5, thin electron transport light emitting film 4, thin hole transport film 3, and first electrode 2 can be formed by the same methods as in the above first embodiment.

Figure 3:
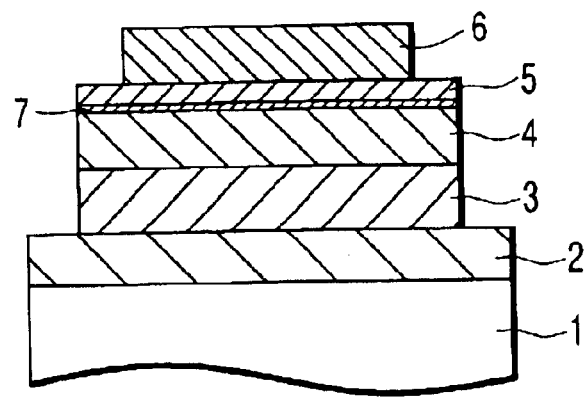
FIG. 3 is a schematic sectional view showing the electrode structure of an organic electroluminescence device according to the third embodiment of the present invention.

FIG. 3 shows the third embodiment of the organic electroluminescence device of the present invention. As shown in FIG. 3, in the organic electroluminescence device of this embodiment, a first electrode 2 made of a predetermined electrode material such as ITO is formed on one surface of a substrate 1. This first electrode 2 can be formed into stripes (not shown) at a predetermined pitch, e.g., a few tens of $\mu$m to several hundred $\mu$m, with a thickness of about 10 to 200 nm.

On the surface of the first electrode 2, a thin hole transport film 3 about 50 nm thick made of a hole transport film material, and a thin electron transport light emitting film 4 about 50 nm thick made of an electron transport light emitting film material are stacked. On the surface of the thin electron transport light emitting film 4, a thin mixture film 7 about 0.1 to 100 nm thick made of a lanthanoid-based insulating material and organic compound.

As the lanthanoid-based insulating material, an oxide or fluoride of lanthanoid can be used. As the organic compound, an arbitrary organic compound which achieves an electron injecting function when mixed with the lanthanoid-based insulating material can be used. As the organic compounds, it is possible to use, e.g., aluminum quinolinol complex (Alq3), oxadiazole derivative, benzoxazolethiophene derivative, perylene derivative, or phenanthroline derivative.

On the surface of the thin mixture film 7, a thin lanthanoid-based insulating film 5 is formed. On the surface of this thin lanthanoid-based insulating film 5, a second electrode 6 about 10 to 200 nm thick made of a predetermined electrode material is formed. The second electrode 6 can be formed into stripes (not shown) having a predetermined pitch so as to face the first electrode 2 in a direction perpendicular to the stripe shape of the first electrode 2.

As shown in FIG. 3, whether to form the thin lanthanoid-based insulating film 5 can be selected. That is, it is also possible to form a stacked structure in which the substrate 1, the first electrode 2, the thin hole transport film 3, the thin electron transport light emitting film 4, the thin mixture film 7 of the lanthanoid-based insulating material and organic compound, and the second electrode 6 are formed in this order from the bottom, without forming the thin lanthanoid-based insulating film 5 as a constituent element.

The use of the thin mixture film 7 of the lanthanoid-based insulating material and organic compound increases the electron injection amount, since the LUMO level of this thin mixture film is effectively reduced by the work function of the metal. Also, an organic film/cathode interface is generally unstable owing to oxidation, adhesion, and the like. However, the stability improves when the lanthanoid-based insulating material is mixed.

The second electrode 6, thin insulating film 5, thin electron transport light emitting film 4, thin hole transport film 3, and first electrode 2 can be formed by the same methods as in the first embodiment. The thin mixture film 7 of the lanthanoid-based insulating material and organic compound can be formed by the following methods. For example, as a method which gives no damage to the underlying thin electron transport light emitting film 4, it is possible to primarily use a co-deposition method using two deposition sources such as an organic material and lanthanoid. It is also possible to use binary sputtering methods such as DC, AC, and ECR sputtering.

The structure and operation of the organic electroluminescence device according to the first embodiment actually fabricated will be described. An ITO film was formed as a first electrode 2 on a transparent substrate 1, and a triphenylamine derivative (TPD) 50 nm thick was formed as a thin hole transport film 3 on the surface of the first electrode 2. On the surface of this TPD film, an aluminum quinolinol complex (Alq$_3$) 50 nm thick was formed as a thin electron transport light emitting film 4. On the surface of this thin electron transport light emitting film 4, an insulating layer 5 having a thickness of 1 nm was formed using a lanthanoid-based insulating material (CeF$_3$, PrF$_3$, or LuF$_3$) or LiF. An aluminum layer 70 nm thick was formed as a second electrode 6 on the surface of the insulating layer 5.

For comparison, a sample was fabricated by forming a second electrode 6 made of aluminum directly on the surface of a thin electron transport light emitting film 4 without forming any lanthanoid-based insulating material layer.

Figure 4:
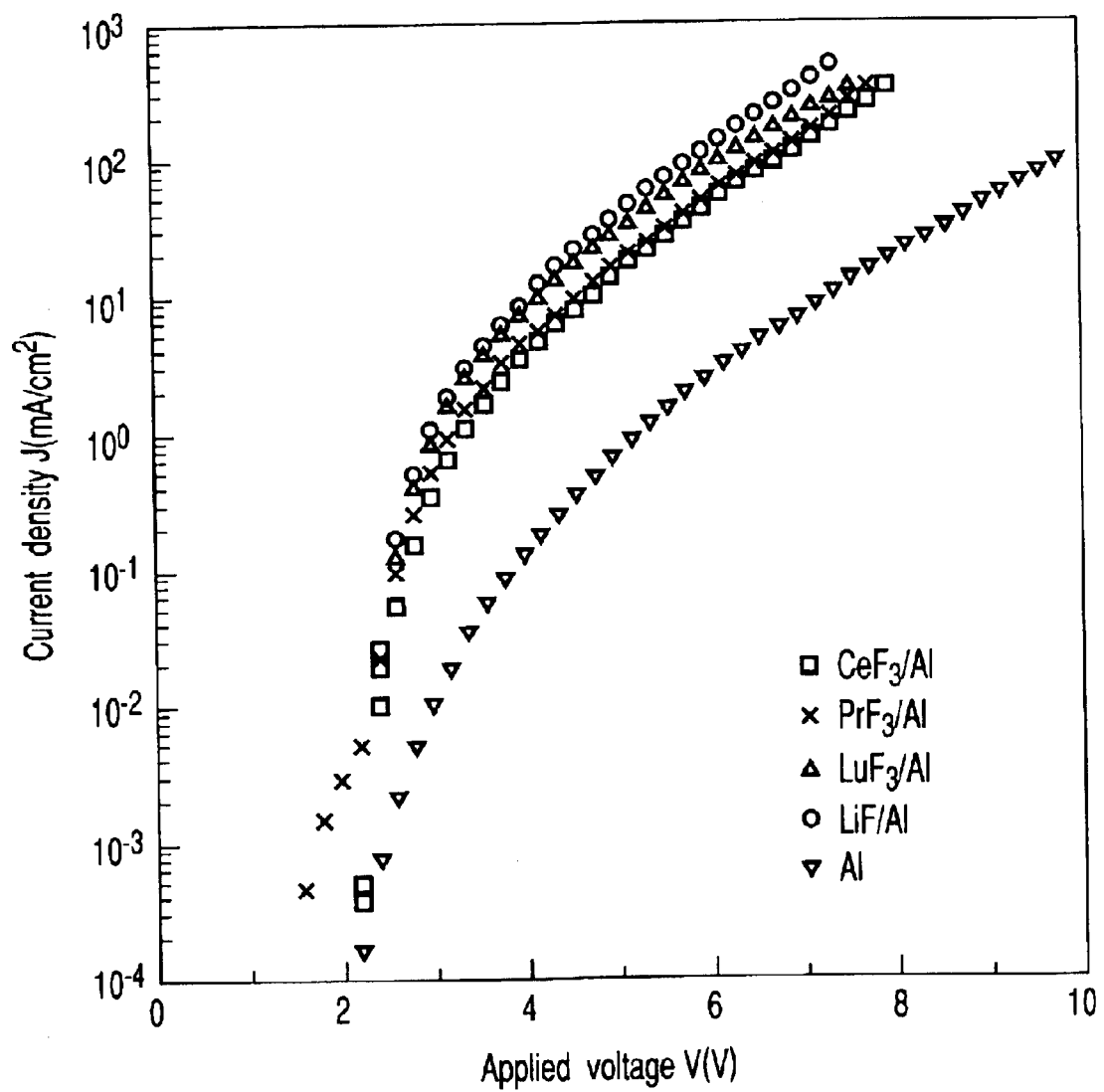
FIG. 4 is a graph showing the relationship between the current density and applied voltage of an organic electroluminescence device according to an embodiment of the present invention.
Figure 5:
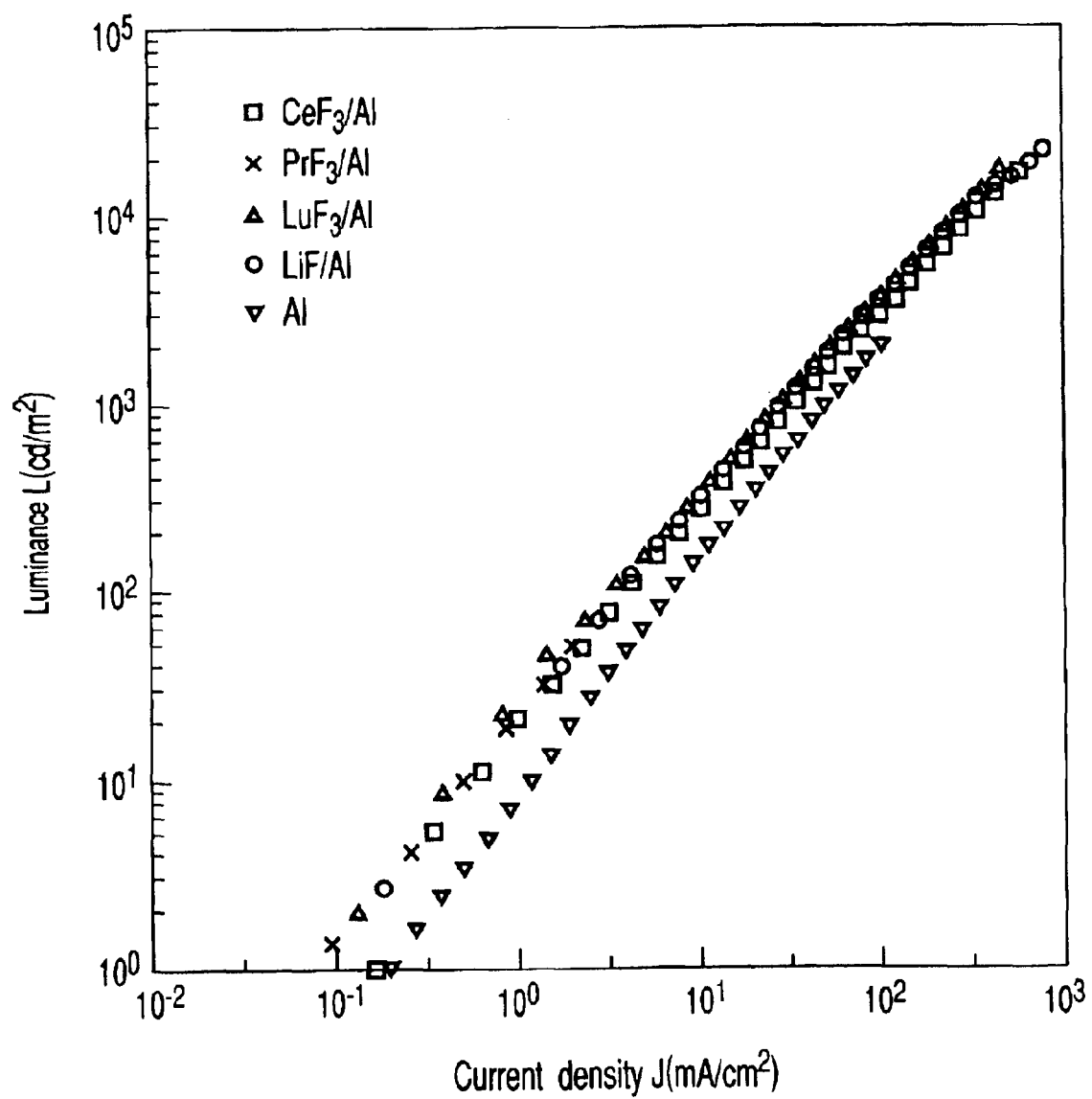
FIG. 5 is a graph showing the relationship between the luminance and current density of an organic electroluminescence device according to an embodiment of the present invention.

FIGS. 4 and 5 depict the current density—applied voltage characteristics and luminance—current density characteristics of the thus formed organic electroluminescence devices. That is, FIG. 4 shows the measurement results of the relationship between the applied voltage and current density when the voltage was applied by using the ITO electrode as a positive electrode and the Al electrode as a negative electrode. As shown in FIG. 4, an electric current was observed from a low voltage of 2V or less, and this electric current abruptly rose at about 2.5V. FIG. 4 indicates that a current value improved by an order of magnitude or more for the same voltage compared to the device in which no lanthanoid-based insulating film material was sandwiched (only the Al electrode was formed, indicated by symbol ▽). Luminescence occurred from 2.8V, and a luminance of 10,000 cd/m$^2$ was obtained at a voltage of 10V or less. The luminance values of the individual portions were uniform over the entire device.

Also, as shown in FIG. 5, a substantially twofold luminance was obtained for the same current density compared to the device in which no lanthanoid-based insulating film material was sandwiched (only the Al electrode was formed, indicated by symbol ▽).

The above operation example explains only the first embodiment. However, even in the second and third embodiments, a low-voltage operation, uniform light emission surface, and high luminance could be obtained as in the first embodiment.

As has been described above, an embodiment of the present invention can provide an organic electroluminescence device having a phosphor light emitting layer and hole transport layer stacked between a cathode and anode, and having an electron injection layer containing a lanthanoid compound or the like between the light emitting layer and cathode. This organic electroluminescence device operates at a low applied voltage of 2.8V, and has a light emission surface whose emission intensity under the same conditions is uniform over the entire display panel. Furthermore, a high luminance of 10,000 cd/m$^2$ can be obtained at an operating voltage of 10V or less, so high-quality display is possible.

The several embodiments of the present invention have been explained with reference to the accompanying drawing. However, these embodiments of the present invention described above are merely examples, so various modifications are obviously possible without departing from the technical scope of the present invention.

What is claimed is:

1. An organic electroluminescence device comprising:
   an anode;
   a hole transport layer made of an organic compound;
   a light emitting layer made of an organic compound;
   an electron injection layer containing a lanthanoid fluoride; and
   a cathode,
   the anode, hole transport layer, light emitting layer, electron injection layer, and cathode being stacked in the order named.

2. A device according to claim 1, wherein the cathode is made of a transparent conductive material.

3. A device according to claim 1, wherein the anode and cathode are made of a transparent conductive material.

4. A device according to claim 1, wherein the film thickness of the electron injection layer is not more than 3 nm.

5. An organic electroluminescence device comprising:
   an anode;
   a hole transport layer made of an organic compound;
   a light emitting layer made of an organic compound;
   an electron injection layer formed by mixing a lanthanoid metal oxide and organic compound; and
   a cathode,
   the anode, hole transport layer, light emitting layer, electron injection layer, and cathode being stacked in the order named.

6. An organic electroluminescence device comprising:
   an anode;
   a hole transport layer made of an organic compound;
   a light emitting layer made of an organic compound;
   an electron injection layer formed by mixing a lanthanoid fluoride and organic compound; and
   a cathode,
   the anode, hole transport layer, light emitting layer, electron injection layer, and
   cathode being stacked in the order named.

* * * * *